(12) United States Patent
Luedeke et al.

(10) Patent No.: US 7,514,924 B2
(45) Date of Patent: Apr. 7, 2009

(54) MAGNETIC RESONANCE RECEIVE COIL WITH DYNAMIC RANGE CONTROL

(75) Inventors: Kai-Michael Luedeke, Hamburg (DE); Volkmar Schulz, Lubeck (DE); Marinus J. A. M. Van Helvoort, Best (NL); Jan Den Boef, Best (NL); Bert L. De Vries, Best (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 133 days.

(21) Appl. No.: 11/575,334

(22) PCT Filed: Aug. 19, 2005

(86) PCT No.: PCT/IB2005/052735

§ 371 (c)(1),
(2), (4) Date: Mar. 15, 2007

(87) PCT Pub. No.: WO2006/030331

PCT Pub. Date: Mar. 23, 2006

(65) Prior Publication Data

US 2008/0204027 A1   Aug. 28, 2008

Related U.S. Application Data

(60) Provisional application No. 60/610,484, filed on Sep. 16, 2004.

(51) Int. Cl.
*G01V 3/00* (2006.01)
(52) U.S. Cl. ..................... 324/309; 324/307
(58) Field of Classification Search ......... 324/300–322; 600/407–445
See application file for complete search history.

(56) References Cited

U.S. PATENT DOCUMENTS

| | | | | |
|---|---|---|---|---|
| 4,700,138 A | * | 10/1987 | Shimazaki et al. | 324/322 |
| 4,994,746 A | * | 2/1991 | Panosh | 324/322 |
| 5,051,903 A | * | 9/1991 | Pelc et al. | 324/309 |
| 5,230,338 A | | 7/1993 | Allen et al. | |
| 5,245,288 A | | 9/1993 | Leussler | |
| 5,451,876 A | * | 9/1995 | Sandford et al. | 324/322 |
| 5,546,081 A | | 8/1996 | Baumgartl | |
| 5,546,082 A | * | 8/1996 | LaRocca et al. | 341/166 |

(Continued)

FOREIGN PATENT DOCUMENTS

JP   2000237161 A   9/2000

OTHER PUBLICATIONS

Oh, C. H., et al.; Effective Dynamic Range Improvement of NMR Signal Detection by Using Analog Programmable Attenuators; ISMRM; 1989.

(Continued)

*Primary Examiner*—Brij B Shrivastav

(57) ABSTRACT

A radio frequency receive coil (50) includes an antenna (52, 52') that is tuned to a magnetic resonance frequency to detect a magnetic resonance signal. Electronics (54) disposed on or with the antenna (52, 52') as a unitary structure include compression circuitry (102, 114, 202, 214, 230, 330, 430, 530) that compresses the magnetic resonance signal at a gain controlled by a gain control signal to produce a compressed magnetic resonance signal. The electronics (54) generate a reduced dynamic range representation of the magnetic resonance signal based on the compressed magnetic resonance signal. The reduced dynamic range representation of the magnetic resonance signal is communicated off the receive coil.

25 Claims, 9 Drawing Sheets

U.S. PATENT DOCUMENTS

Figure 3:
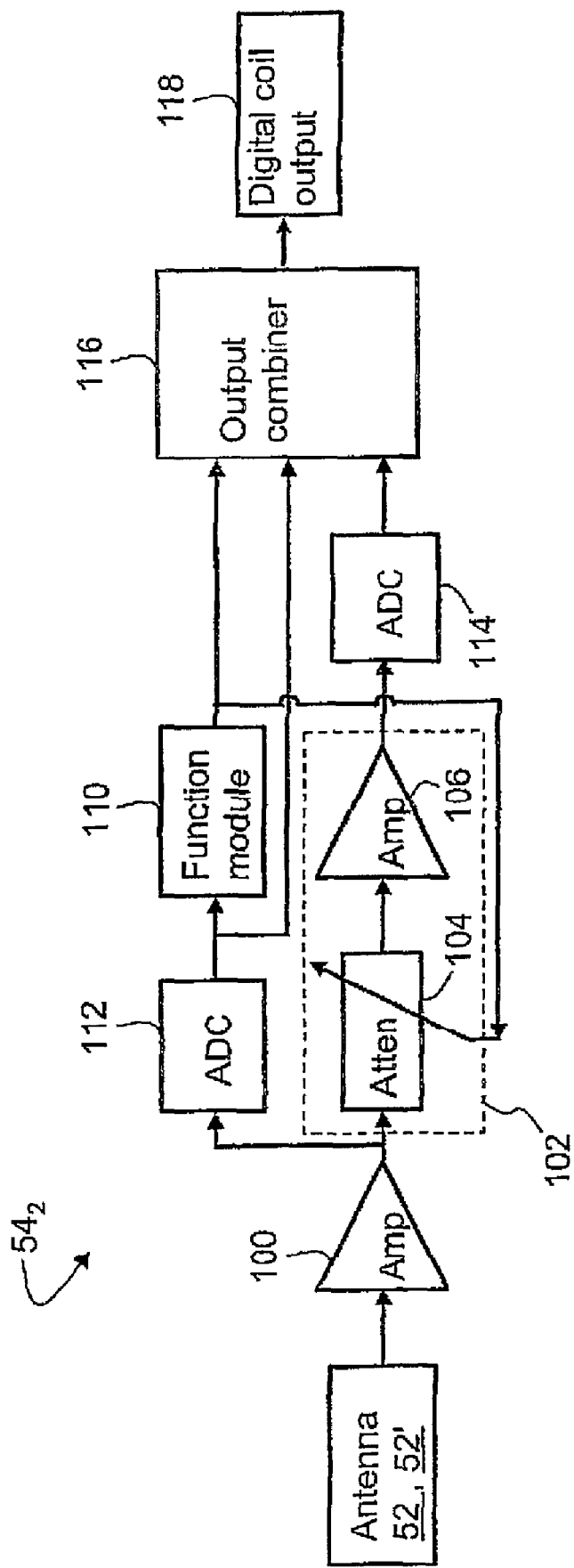

| | | | |
|---|---|---|---|
| 6,043,659 A * | 3/2000 | McKinnon | 324/322 |
| 6,195,031 B1 | 2/2001 | Feld et al. | |
| 6,259,253 B1 * | 7/2001 | Ellingson | 324/322 |
| 6,448,770 B1 | 9/2002 | Liu et al. | |
| 6,489,992 B2 * | 12/2002 | Savoye | 348/340 |
| 6,822,445 B2 * | 11/2004 | Vester | 324/307 |
| 2002/0058868 A1 | 5/2002 | Hoshino et al. | |
| 2003/0062895 A1 * | 4/2003 | Vester | 324/307 |
| 2003/0076105 A1 | 4/2003 | Feld et al. | |
| 2003/0206019 A1 | 11/2003 | Boskamp | |
| 2004/0054489 A1 | 3/2004 | De La Barrera et al. | |
| 2004/0087852 A1 | 5/2004 | Chen et al. | |
| 2006/0244452 A1 * | 11/2006 | Den Boef | 324/322 |

OTHER PUBLICATIONS

Coutts, G. A., et al.; Integrated and Interactive Position Tracking and Imaging of Interventional Tools and Internal Devices Using Small Fiducial Receiver Coils; MRM; 40:908-913; 1998.

Analog Devices-IF Digitizing Subsystem; AD9874, Rev. A; 40 pages; 2003; Analog Devices, Inc.

Analog Devices—Low-Power IC Digitizes 300 MHz IF; 7 pages.

Groza, V. Z.; High-Resolution Floating-Point ADC; IEEE Trans. on Instrumentation & Measurement; 2001; 50(6) 1822-1829.

* cited by examiner

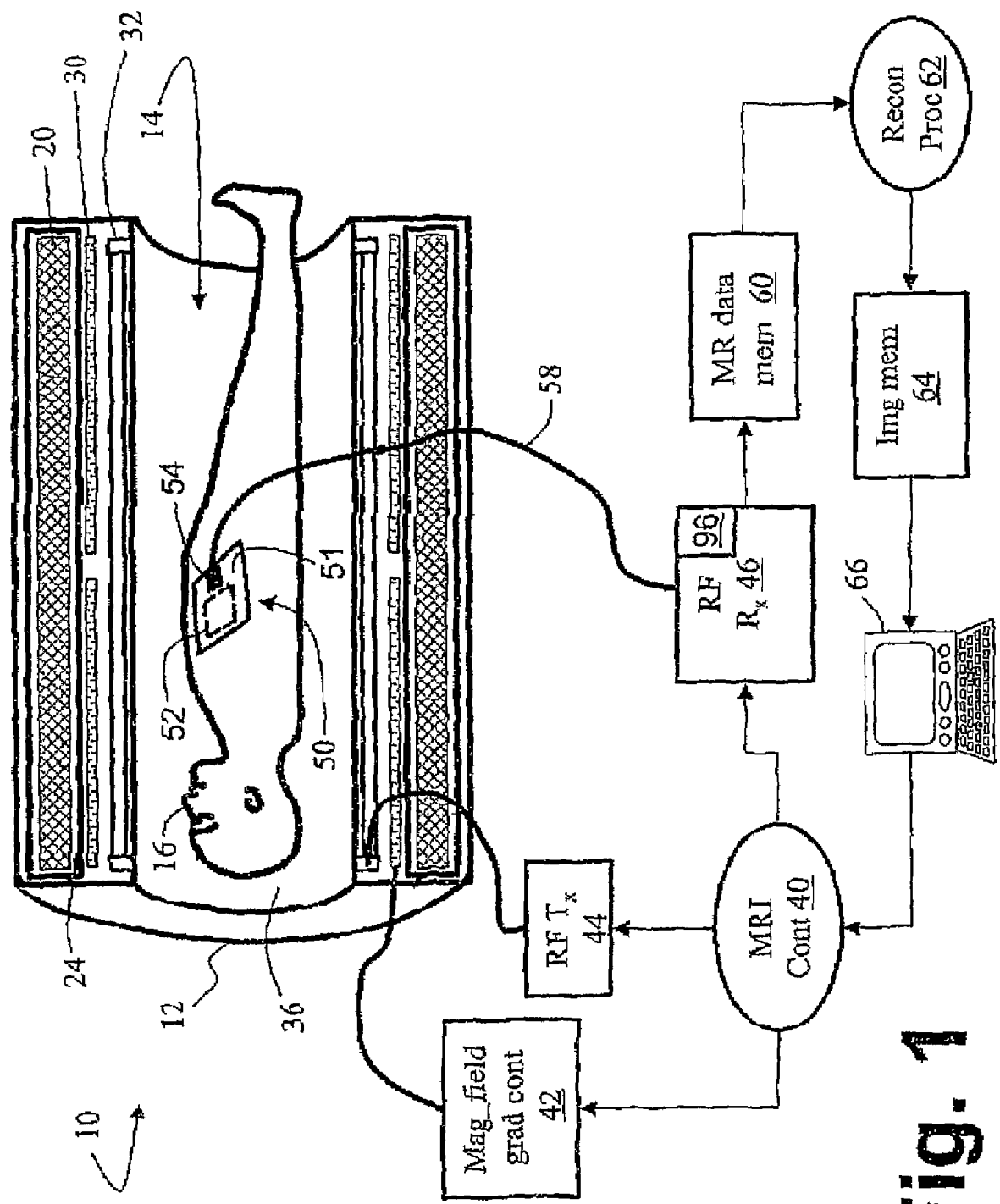

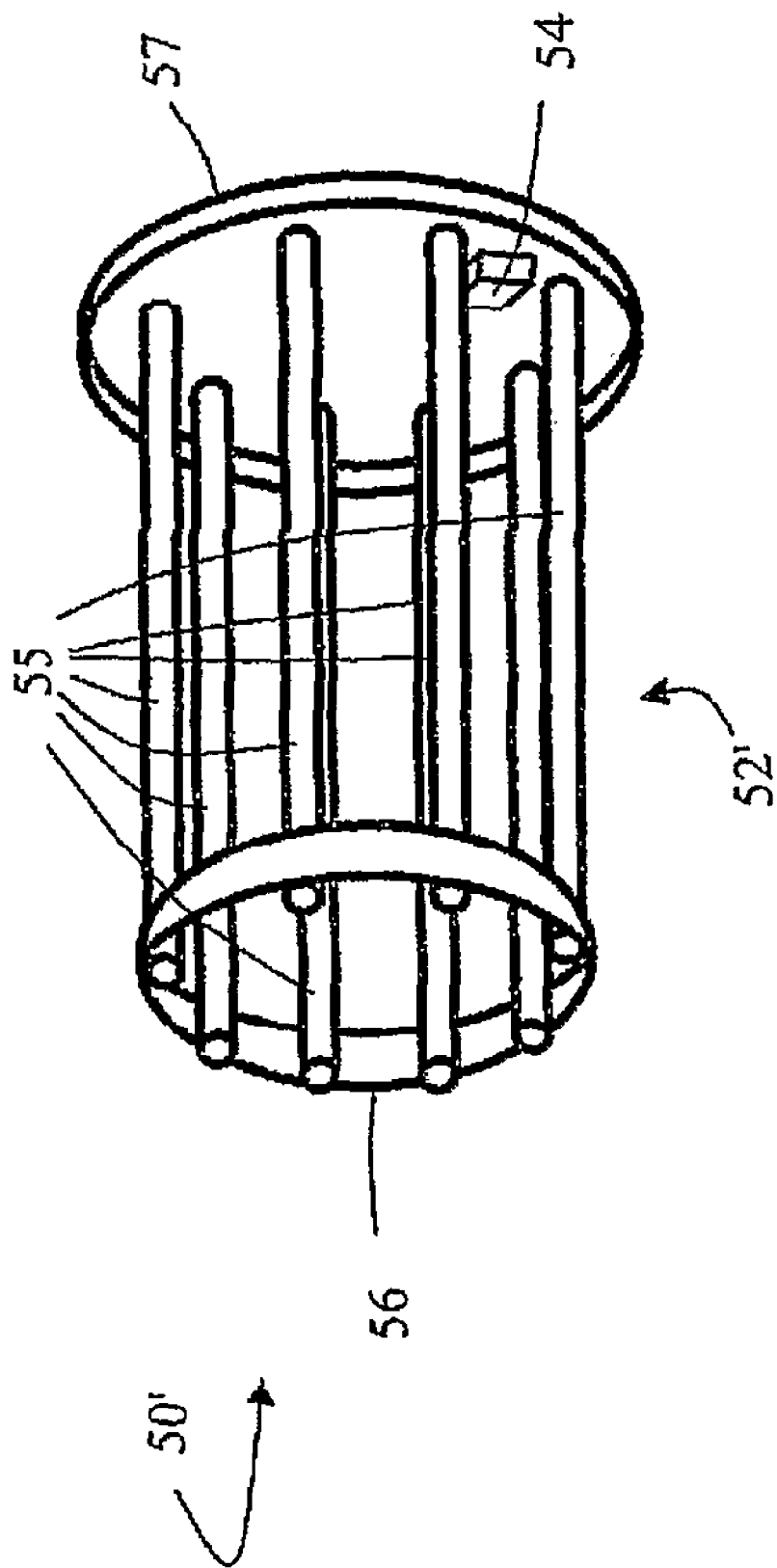

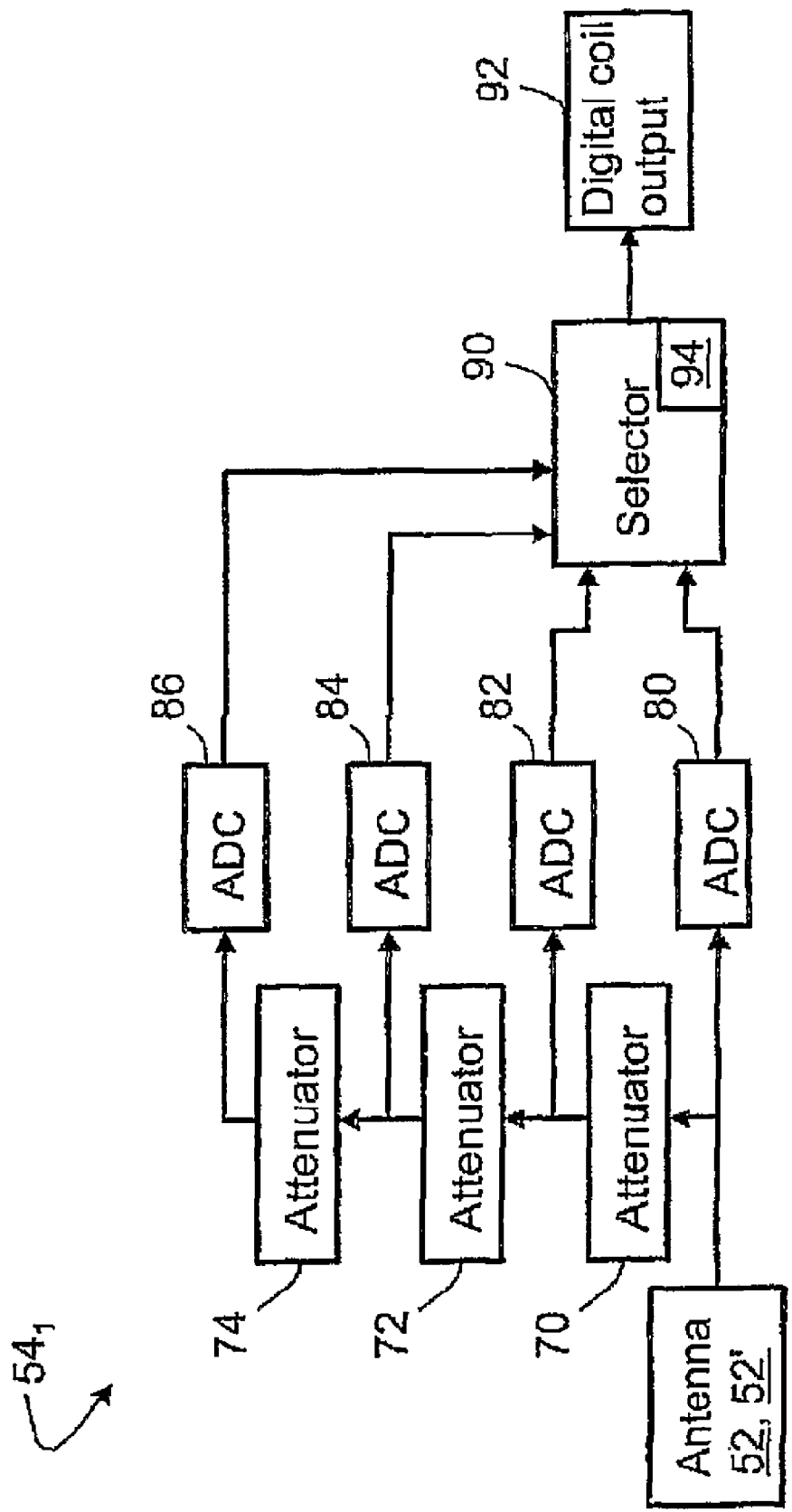

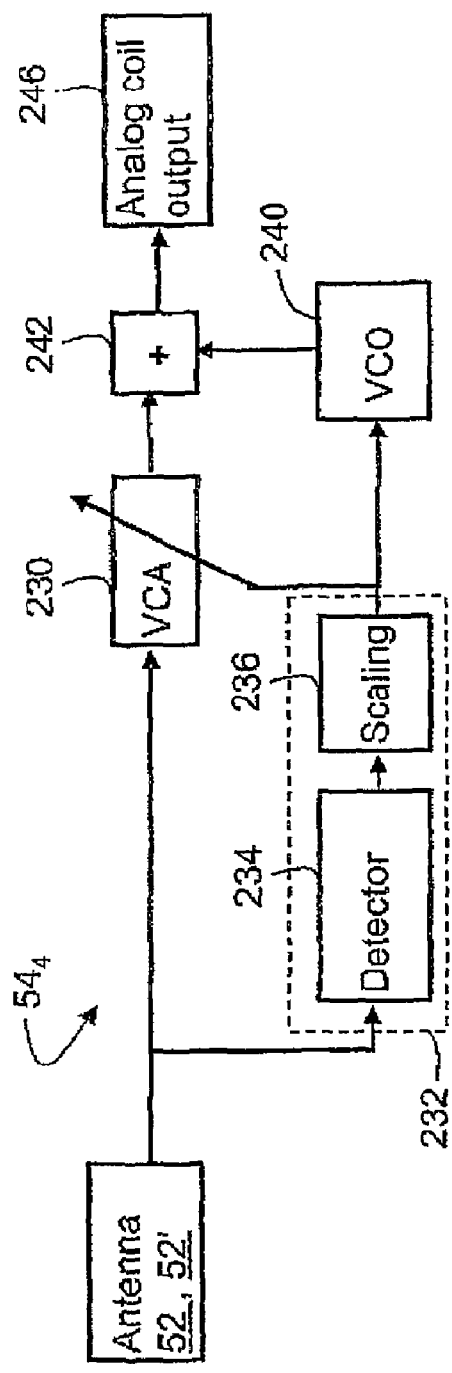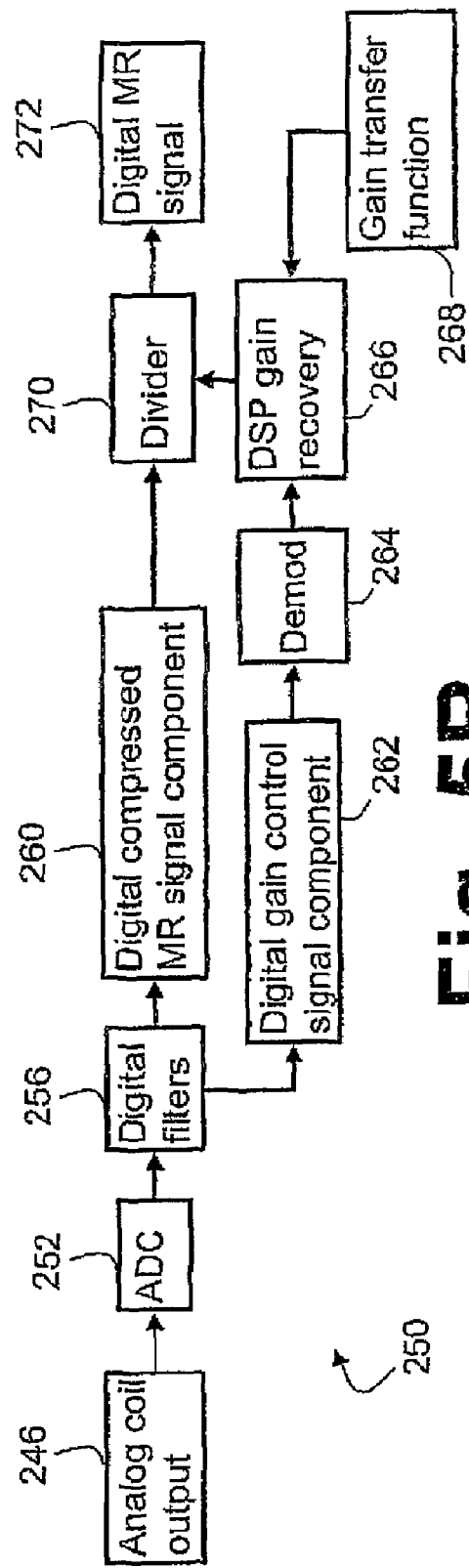
Fig. 5A
Fig. 5B

MAGNETIC RESONANCE RECEIVE COIL WITH DYNAMIC RANGE CONTROL

CROSS REFERENCE TO RELATED APPLICATIONS

This application claims the benefit of U.S. provisional application Ser. No. 60/610,484 filed Sep. 16, 2004, which is incorporated herein by reference.

The following finds particular application in conjunction with receive coils for magnetic resonance imaging scanners, and will be described with particular reference thereto. However, it finds application in radio frequency receive systems generally.

For some magnetic resonance imaging data acquisition methods, such as those in which read-out vectors correspond to trajectories through the centre of the k-space, the dynamic range of presently available analog-to-digital converters is not high enough to digitize the entire range between the noise floor and the peak signal level without introducing non-negligible levels of digitization quantization noise or other deleterious noise or distortion.

For some magnetic resonance imaging scanners, the transmission path or medium between receive coil and the analog-to-digital converter does not have sufficient dynamic range. In wireless receive coils having limited power, it may be undesirable to used the limited available on-coil power to drive an analog-to-digital converter disposed on the coil. Accordingly, in such receive coils the analog-to-digital converter may be located remotely from the coil, for example in the radio frequency receiver, and an analog magnetic resonance signal is transmitted off the coil by optical fiber, wireless infra-red transmission, or so forth. Such transmission paths may have limited dynamic range, which negatively impacts the signal-to-noise ratio.

The following contemplates improved apparatuses and methods that overcome the aforementioned limitations and others.

According to one aspect, a radio frequency receive coil is disclosed for use in a magnetic resonance imaging scanner. The coil includes an antenna tuned to a magnetic resonance frequency to detect a magnetic resonance signal. Electronics disposed on or with the antenna as a unitary structure include compression circuitry that compresses the magnetic resonance signal at a gain controlled by a gain control signal to produce a compressed magnetic resonance signal. The electronics generate a reduced dynamic range representation of the magnetic resonance signal based on the compressed magnetic resonance signal. The reduced dynamic range representation of the magnetic resonance signal is communicated off the receive coil.

According to another aspect, a magnetic resonance imaging scanner is disclosed. A main magnet produces a main magnetic field in an imaging volume. Magnetic field gradient coils selectively superimpose selected magnetic field gradients on the main magnetic field within the imaging volume. A radio frequency transmitter selectively injects a radio frequency excitation at a magnetic resonance frequency into the imaging volume. A radio frequency receive coil receives a magnetic resonance signal generated in the imaging volume by the injected radio frequency excitation. A radio frequency receiver receives a reduced dynamic range representation of the magnetic resonance signal communicated off the receive coil. The receive coil includes an antenna and electronics disposed on or with the antenna as a unitary structure. The electronics include compression circuitry that compresses the magnetic resonance signal at a gain controlled by a gain control signal to produce a compressed magnetic resonance signal. The electronics generate the reduced dynamic range representation of the magnetic resonance signal based on the compressed magnetic resonance signal.

According to yet another aspect, a radio frequency receive coil is disclosed for use in a magnetic resonance imaging scanner. An antenna is tuned to a magnetic resonance frequency to detect a magnetic resonance signal. Electronics are disposed on or with the antenna as a unitary structure. The electronics include: a plurality of amplifiers each having an output with a different gain respective to the antenna; digitizing circuitry that digitizes at least a selected highest amplifier output that does not overload the digitizing circuitry; and encoding circuitry that combines the digitized output with an indication of the selected amplifier gain to produce a reduced dynamic range representation of the magnetic resonance signal that is communicated off the receive coil.

According to still yet another aspect, a radio frequency receive method is provided for use in a magnetic resonance imaging scanner. A magnetic resonance signal is detected using an antenna tuned to a magnetic resonance frequency. The detected magnetic resonance signal is processed using electronics disposed on or with the antenna as a unitary structure. The processing includes: compressing the magnetic resonance signal at a gain controlled by a gain control signal to produce a compressed magnetic resonance signal; generating a reduced dynamic range representation of the magnetic resonance signal based on the compressed magnetic resonance signal; and communicating the reduced dynamic range representation of the magnetic resonance signal off the receive coil.

One advantage resides in improved signal to noise ratio for detected magnetic resonance signals.

Another advantage resides in improved dynamic range for magnetic resonance receive coils.

Yet another advantage resides in facilitating wireless magnetic resonance receive coils.

Still another advantage resides in reduced distortion and intermodulation of the magnetic resonance signal.

Numerous additional advantages and benefits will become apparent to those of ordinary skill in the art upon reading the following detailed description.

The invention may take form in various components and arrangements of components, and in various process operations and arrangements of process operations. The drawings are only for the purpose of illustrating preferred embodiments and are not to be construed as limiting the invention.

FIG. 1 diagrammatically illustrates a magnetic resonance imaging system including a radio frequency receive coil incorporating dynamic compression.

FIG. 1A diagrammatically illustrates another receive coil that can be used with the magnetic resonance imaging system of FIG. 1.

FIGS. 2, 3, 4, 5A, 6, and 7 diagrammatically illustrate six example embodiments of the electronics of the radio frequency receive coil of FIG. 1.

FIG. 5B diagrammatically illustrates an embodiment of off-coil signal processing circuitry suitable for recovering a digital representation of the original magnetic resonance signal generated by the example electronics of FIG. 5A.

Figure 8:
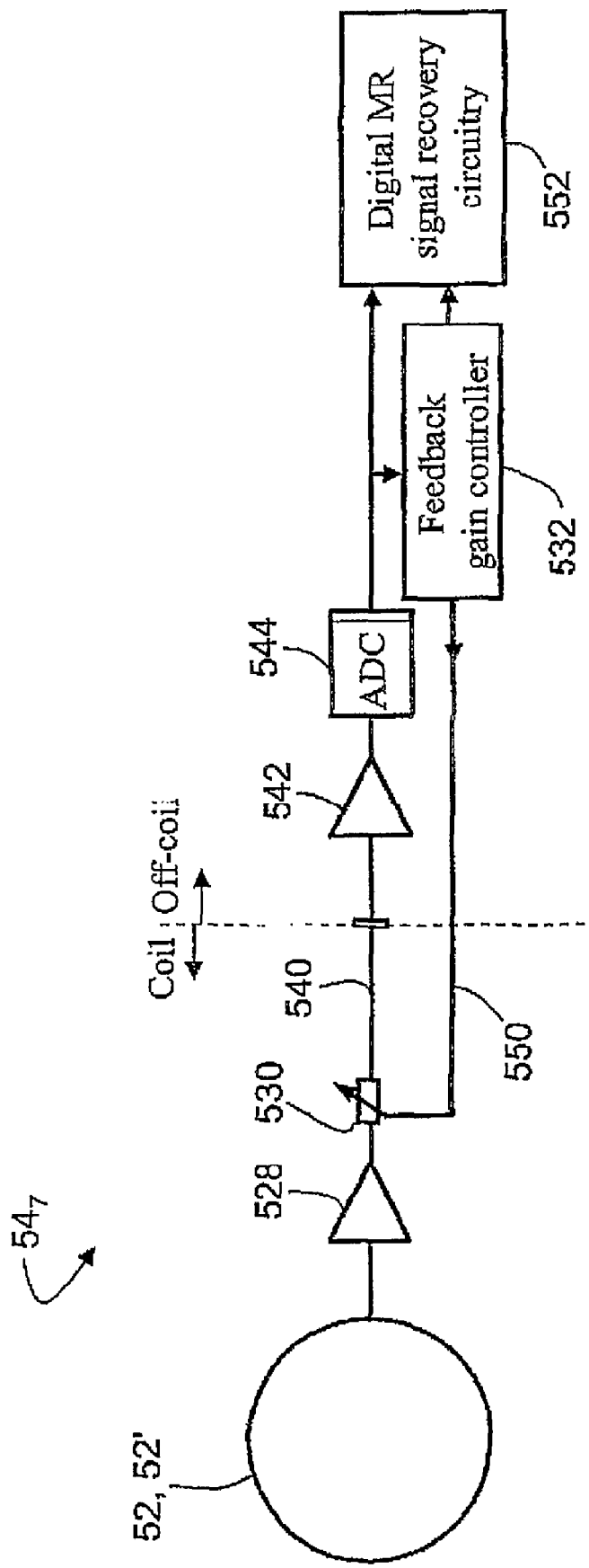

FIG. 8 diagrammatically illustrates an arrangement in which the coil electronics include compression circuitry, and the feedback gain controller that controls the compression circuitry is placed off-coil.

With reference to FIG. 1, a magnetic resonance imaging scanner 10 includes a housing 12 defining a generally cylindrical scanner bore 14 inside of which an associated imaging subject 16 is disposed. Main magnetic field coils 20 are disposed inside the housing 12, and produce a main $B_0$ magnetic field directed generally parallel with the cylinder axis of the scanner bore 14. The main magnetic field coils 20 are typically superconducting coils disposed inside cryoshrouding 24, although resistive main magnets can also be used. The housing 12 also houses or supports magnetic field gradient coils 30 for selectively producing magnetic field gradients in the bore 14. The housing 12 further houses or supports a radio frequency body coil 32 for selectively exciting magnetic resonances. Alternatively, a head coil, surface coil, or other local coil can be used for exciting magnetic resonances. The housing 12 typically includes a cosmetic inner liner 36 defining the scanner bore 14.

The main magnetic field coils 20 produce a main $B_0$ magnetic field. A magnetic resonance imaging controller 40 operates magnetic field gradient controllers 42 to selectively energize the magnetic field gradient coils 30, and operates a radio frequency transmitter 44 coupled to the radio frequency coil 32 to selectively inject radio frequency excitation pulses into the imaging subject 16. By selectively operating the magnetic field gradient coils 30 and the radio frequency coil 32, magnetic resonance is generated and spatially encoded in at least a portion of a region of interest of the imaging subject 16. By applying selected magnetic field gradients via the gradient coils 30, a selected k-space trajectory is traversed, such as a Cartesian trajectory, a plurality of radial trajectories, a spiral trajectory, or so forth.

During imaging data acquisition, the magnetic resonance imaging controller 40 operates a radio frequency receiver 46 coupled to a radio frequency receive coil 50, or coupled to an array of similar local coils, to acquire magnetic resonance samples that are stored in a magnetic resonance data memory 60. The radio frequency receive coil 50 is disposed inside the bore 14 close to or in contact with the imaging subject 16. In some embodiments, the receive coil 50 is battery-powered. While a single surface coil 50 is shown, in some applications a plurality of surface coils are employed in a phased array or other configuration. Moreover, the receive coil 50 can be embodied by other local coils besides a surface coil. For example, the receive coil 50 can be a head coil that surrounds the head, a knee coil, or so forth.

The receive coil 50 includes a common substrate or support 51 on or in which a radio frequency receive antenna 52 is disposed. The antenna 52 is tuned to the frequency of magnetic resonance generated by the combination of radio frequency excitation and applied $B_0$ magnetic field, and has a bandwidth spanning at least the magnetic resonance frequency encoding bandwidth. Thus, the antenna 52 detects generated magnetic resonance signals. Electronics 54 disposed on or in the common substrate or support 51 provide dynamic compression of the detected magnetic resonance signals and other optional signal processing, such as optional analog to digital conversion, optional conversion to an infra-red, optical, or other transmission medium, or so forth. In the illustrated embodiments, the electronics 54 are disposed in an electronics module. In some embodiments, the compressed coil signal is digitized on the coil 50 and transmitted to the receiver 46 in a floating point or other digital format that intrinsically incorporates the compression. In other embodiments, the compressed coil signal is transmitted to the receiver 46 along with information about the compression, and the coil output signal is decompressed at the receiver 46 using the transmitted compression information. Although not shown, the receive coil 50 is optionally disposed in a protective housing or cover, encased in a waterproof layer, may include soft padding, securing straps, or so forth, or be otherwise configured for cosmetic, safety, patient comfort, or other considerations.

In the illustrated surface coil, the common support 51 is a generally planar substrate, and the antenna 52 can be, for example, copper or other electrically conductive traces formed on the substrate 51. In some embodiments, the electronics module 54 may be disposed on or in one of the conductors of the antenna 52. In embodiments in which the antenna is defined by rings, rungs, or other non-planar components (such as, for example, a head coil, knee coil, or the like), the electronics module is suitably disposed directly on one or more of the antenna components, or can be attached therewith as a unitary structure via a suitable additional support structure.

With reference to FIG. 1A, an example of such a coil 50' is shown, which can be substituted for the coil 50 of FIG. 1. The coil 50' includes an end-capped birdcage antenna 52' defined by eight parallel rungs 55, an end ring 56 disposed at one end of the parallel rungs 55, and an end cap 57 disposed at the opposite end of the parallel rungs 55. The electronics module 54 is suitably disposed on one of the components 55, 56, 57 of the birdcage antenna 52', and is specifically disposed on the end cap 57 in the specific embodiment illustrated in FIG. 1A.

In some embodiments the coil output signal is an analog or digital electrical or optical signal transmitted over an electrical or optical cable 58. In the electrical embodiment, the cable includes one or more electrical conductors which are used to transmit the electrical coil output signal to the receiver 46. In embodiments where the coil output signal is an analog or digital optical signal, the cable 58 includes an optical fiber or bundle of optical fibers. In embodiments where the coil output signal is an analog or digital infra-red or other broadcast electromagnetic signal, the cable 58 is suitably omitted, and the signal received by an infra-red detector, antenna, or other receiving element (not shown in FIG. 1) of the receiver 46.

The coil output signal is received at the receiver 46, and is dynamically decompressed (if it was transmitted in a compressed format) to recover the detected magnetic resonance signal. The receiver 46 demodulates the signal, and optionally performs further processing, to produce magnetic resonance imaging data that are stored in the magnetic resonance data memory 60. The acquired magnetic resonance imaging data are reconstructed by a reconstruction processor 62 into an image representation using a Fourier transform-based reconstruction algorithm, a filtered backprojection-based reconstruction algorithm, or other suitable image reconstruction algorithm. The reconstructed image or images generated by the reconstruction processor 62 are stored in an images memory 64, and can be displayed on a user interface 66, stored in non-volatile memory, transmitted over a local intranet or the Internet, viewed, stored, manipulated, or so forth. The user interface 66 also preferably enables a radiologist, technician, or other operator of the magnetic resonance imaging scanner 10 to communicate with the magnetic resonance imaging controller 40 to select, modify, and execute magnetic resonance imaging sequences.

The described magnetic resonance imaging system is an illustrative example only. The described radio frequency receive coils or their equivalents can be used with substantially any type of magnetic resonance imaging scanner, including but not limited to horizontal bore scanners, vertical bore scanners, open magnet scanners, and so forth. Moreover, the described radio frequency receive coils or their equivalents can be combined to define arrays of receive coils for parallel imaging, SENSE imaging, or the like.

With reference to FIG. 2, an example embodiment of the electronics module 54 designated as electronics module 54₁ is described. A cascade of amplifiers 70, 72, 74 are connected with the antenna 52 of the receive coil 50, or with the antenna 52' of the receive coil 50'. While three amplifiers are illustrated, a larger or smaller number of amplifiers can be used. The output of each amplifier is reduced or attenuated by a selected factor. For example, in some embodiments each of the amplifiers 70, 72, 74 attenuates the signal by a factor of two, so that in the illustrated example the output of amplifier 70 is reduced by a factor of two, the output of amplifier 72 is reduced by a factor of four (including the reduction due to the cascaded amplifier 70), and the output of amplifier 74 is reduced by a factor of eight (including the reduction due to the cascaded amplifiers 70, 72). In FIG. 2, the unattenuated output of the antenna 52 or the antenna 52' is also available, providing four levels of attenuation including the unattenuated detected magnetic resonance signal. Rather than cascading attenuators as shown in FIG. 2, attenuators having different attenuation values can be placed into parallel, with each attenuator receiving the unattenuated detected magnetic resonance signal from the antenna. Moreover, while the illustrated amplifiers 70, 72, 74 attenuate the signal (that is, have gain<1), it is to be appreciated that in other embodiments the amplifiers, or some portion of the amplifiers, may have an amplifying gain, that is, gain>1.

The output of each amplifier 70, 72, 74, as well as the unattenuated output from the antenna 52 or the antenna 52', is input into a corresponding one of a plurality of analog-to-digital converters 80, 82, 84, 86. A selector 90 selects the digitized output signal from the analog-to-digital converter having the highest, but not overdriven or saturated, output value as a digital coil output 92 of the receive coil 50. The gains of the amplifiers 70, 72, 74 should be selected such that the analog-to-digital converter 86 receiving the most attenuated input can handle the highest anticipated detected magnetic resonance signal level, while the analog-to-digital converter 80 receiving the least attenuated (or most amplified) input (specifically, an unattenuated input in the example embodiment of FIG. 2) can handle the lowest anticipated detected magnetic resonance signal level without substantial degradation in noise performance.

A gain control signal encoder 94 encodes the digital coil output 92 of the selector 90 with a gain control signal indicative of which of the analog-to-digital converters 80, 82, 84, 86 is being used, and hence indicative of the attenuation (that is, gain≦1) employed prior to the digitization. This gain control signal could, for example, be two additional bits having a value selected from a group consisting of: "00" indicating converter 80; "01" indicating converter 82; "10" indicating converter 84; and "11" indicating converter 86. The receiver 46 includes a complementary decoder 96 which recognizes the encoding and controls the decompression accordingly.

In one contemplated variation, instead of using a separate analog-to-digital converter to digitize each level, a single analog-to-digital converter can be used. In this variation, each amplifier output is connected with a sample-and-hold circuit and the selector 90 is high-speed decision circuitry that determines the highest output level that is not yet overloaded and connects it via a multiplexor to the single analog-to-digital converter for digitization.

With reference to FIG. 3, an example embodiment of the electronics module 54 designated as electronics module 54₂ is described. A preamplifier 100 has a gain g1. The output of preamplifier 100 serves as input to a variable gain amplifier 102, which in FIG. 3 includes a cascaded variable gain attenuator 104 and an amplifier 106 having gain g2. In one suitable arrangement, g2 is greater than unity, and the variable gain attenuator 104 has a gain g(atten) that is continuously or discretely variable between 1/g2 and 1 (where gain=1 corresponds to no attenuation). Other variable gain amplifiers can be used in place of the cascaded components 104, 106; for example, a single variable gain amplifier component can be used.

The variable gain amplifier 102 is controlled by a digital function module 110 that receives a digitized value of the preamplified signal produced by an analog-to-digital converter 112. The digital function module 110 outputs a gain control signal that controls the gain of the variable gain attenuator 104. The output of the variable gain amplifier 102 is digitized by an analog-to-digital converter 114 to produce a digital compressed magnetic resonance signal. An output combiner 116 combines the digital compressed magnetic resonance signal output by the analog-to-digital converter 114, which is preferably a high resolution converter, with the digital value output by the analog-to-digital converter 112, which is preferably a fast (e.g., flash) converter optionally having a coarser resolution, to produce a digital coil output 118. In the illustrated embodiment, the variable gain attenuator 104 is digitally controllable. However, an attenuator with analog control input can be used in conjunction with a suitable digital-to-analog converter inserted between the function module 110 and the attenuator, or in conjunction with an analog function module that directly operates on the analog preamplifier signal.

The gain g1 of the preamplifier 100 is preferably selected such that the maximum anticipated magnetic resonance signal level can be digitized by the analog-to-digital converter 112. The gain g2 of the amplifier 106 is preferably selected such that the maximum gain product g1·g2 between antenna and the analog-to-digital converter 114 raises the noise level of the detected magnetic resonance signal enough so that quantization noise of the analog-to-digital converter 114 can be neglected. This maximum gain setting g1·g2 is used for the lowest anticipated signal levels. The digital value output by the analog-to-digital converter 112 is converted to magnitude in the function module 110 and transformed into a suitable control signal for the attenuator 104, such that the total gain g1·g2·g(atten) between antenna and the analog-to-digital converter 114 never overloads the analog-to-digital converter 114. This transformation can include peak detection with a suitably chosen decay time constant, for example a time constant of between one period of the magnetic resonance frequency and the time interval over which significant level changes of the magnetic resonance signal envelope are anticipated, that is, greater than 1/(signal bandwidth).

The gain setting of the attenuator 104 via the analog-to-digital converter 112 is delayed by one or more sampling intervals. This delay is not problematic if the sampling rate is much higher than the signal bandwidth. This condition is generally satisfied in typical magnetic resonance imaging, where for example sampling may be done at 80 Msamples/sec, while the signal bandwidth is usually less than 1.5 MHz. The variable gain attenuator 104 preferably has a short settling time to avoid further delays.

The function module 110 outputs the gain control signal g(atten). The functional dependence of g(atten) versus the digitized preamplified signal level input from analog-to-digital converter 112 is selected to comport with the specific variable gain amplifier being controlled, the anticipated dynamic range of the preamplified signal, and the dynamic range of the analog-to-digital converter 114. In some embodiments, the functional dependence is chosen such that beyond a selected output level of analog-to-digital converter 112, the analog-to-digital converter 114 is driven near but below its maximum input level. In other embodiments, attenuation is increased earlier, such that a dynamic compression transfer function is realized at the input of the analog-to-digital converter 114.

In one example embodiment, the gain of the attenuator/amplifier 102 is made variable between 1 and 100, the gain g1 of the preamplifier 100 is chosen to raise the maximum output signal level of the antenna 52 to just below the maximum input signal level of analog-to-digital converters 112, 114, and the function module 110 produces a variable gain g(atten)=u/x for x>u, and g(atten)=1 for x≦u, where x is the transformed output of the analog-to-digital converter 112 (i.e., some measure of the uncompressed input level) and the threshold u is set to 0.7% of the maximum analog-to-digital converter input level. This way the dynamic range of the magnetic resonance signal can be compressed by 40 dB. Those skilled in the art can readily select other parameters for specific signal levels, available electronics components, and so forth. The gain control signal from the function module 110 is combined with the output signal by the output combiner 116 to instruct the decoder 96 regarding decompression.

Figure 4:
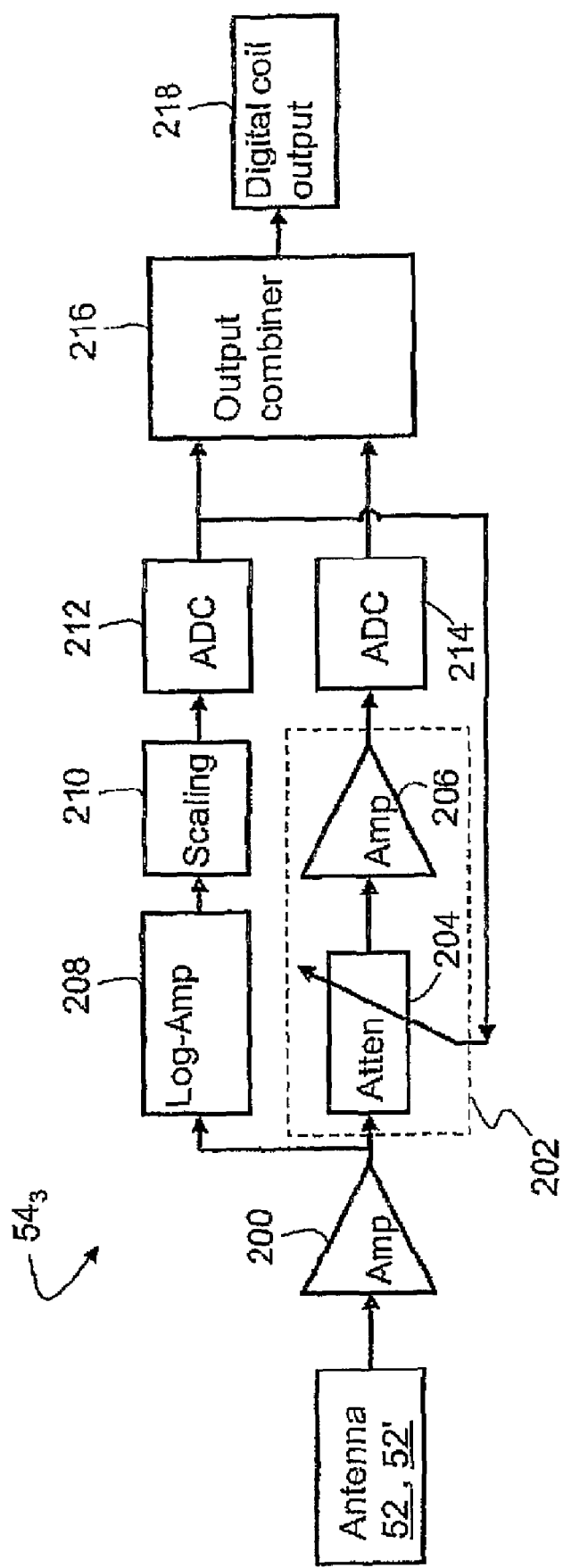

With reference to FIG. 4, an example embodiment of the electronics module 54 designated as electronics module 54₃ is described. A preamplifier 200 has a gain g1. The output of preamplifier 200 serves as input to a variable gain amplifier 202, which in FIG. 4 includes a cascaded variable gain attenuator 204 and an amplifier 206 having gain g2. In one suitable arrangement, g2 is greater than unity, and the variable gain attenuator 204 has a gain g(atten) that is continuously or discretely variable between 1/g2 and 1 (i.e., unattenuated). Other variable gain amplifier layouts can be employed. The variable gain amplifier 202 is controlled by a gain controller including a logarithmic amplifier 208 that outputs a logarithmic value of the preamplified signal, suitable scaling circuitry 210 that scales the logarithmic amplifier output, and an analog-to-digital converter 212 that digitized the logarithmic scaled value. The digital output of the analog-to-digital converter 212 is a gain control signal that controls the gain of the variable gain attenuator 204. In a preferred embodiment, the attenuation (inverse gain) is an exponential function of the control signal or, equivalently, that its attenuation in dB is a linear function of the control signal. In other embodiments, additional digital processing interposed between the analog-to-digital converter 212 and the attenuator 204 (or, alternatively, analog processing inserted before the converter 212) combines with the control transfer function of the attenuator 204 to produce the preferred exponential behavior. The output of the variable gain amplifier 202 is digitized by an analog-to-digital converter 214 to produce a digital compressed magnetic resonance signal. An output combiner 216 combines the digital compressed magnetic resonance signal output by the analog-to-digital converter 214 with the digital value output by the analog-to-digital converter 212 to produce a digital coil output 218.

The logarithmic amplifier 208 and linear-in-dB attenuator 204 is an illustrative example. The upper control path (components 208, 210, 212 in the embodiment of FIG. 4) more generally can implement substantially any non-linear compressing transfer function that derives a coarse measure of the size of the input signal that can in turn serve to achieve a proper control setting of the variable gain amplifier 202. The components of the upper control path do not need to have high precision; rather, the precision of the controlled variable gain amplifier 202 and analog-to-digital converter 214 determine the resolution of the compressed signal.

If the digital output of the analog-to-digital converter 212 is designated as n, and the digital output of the analog-to-digital converter 214 is designated as m, and the logarithmic amplifier 208 output plus scaling in 210 results in a logarithmic value of base B, then the preamplified signal output by the preamplifier 200 is suitably represented by the floating point value $m \times B^n$ where m is the mantissa, B is the base, and n is the exponent. Such a floating point digital format for the digital coil output 218 is convenient for subsequent floating point digital processing by the radio frequency receiver 46. For example, if the attenuator 204 has 15 steps of −3 dB attenuation, then a suitable scaling would be, for example, $B=\sqrt{2}$ (i.e., 3 dB). With suitable selection of the gains of the amplifiers 200, 206 the peak signal levels at the input of the analog-to-digital converter 214 can be kept in a 3 dB band slightly below its maximum rating for more than 40 dB dynamic range. In the numerical processing performed by the output combiner 216, the receiver 46, or elsewhere, the floating point format can be readily changed to a more convenient form, such as a binary base (B=2) or decimal base (B=10) format. The purpose of the upper signal chain 208, 210, 212 is to derive a logarithmic (i.e., dB-scaled) measure of the signal envelope level. So, the logarithmic amplifier 208 can be one of the demodulating or rectifying variety with peak detection used in conjunction with a suitable decay time constant. As the output of the analog-to-digital converter 212 then typically varies slower, the gain controller components 208, 210, 212 can generally be coarse precision, lower frequency components, just fast enough to follow the envelope variation of the magnetic resonance signal. One suitable logarithmic amplifier is the demodulating logarithmic amplifier AD8309 available from Analog Devices. Moreover, the analog-to-digital converter 212 can be a relatively coarse resolution converter. For example, in combination with the example attenuator having 15 steps of −3 dB/step, a four-bit converter is adequate. The precision of the digitization is determined by the variable gain amplifier 202 and the analog-to-digital converter 214. The gain of the variable gain amplifier 202 should be a precise function of its control signal, and the analog-to-digital converter 214 which outputs the mantissa should be a high resolution, high frequency converter.

It will be appreciated that the digital coil output 218 can be viewed in two alternative but substantially equivalent ways. In one view, the digital coil output 218 is an uncompressed magnetic resonance signal output represented by the floating point value $m \times B^n$. In another view, the digital coil output 218 is a compressed magnetic resonance signal output represented by the mantissa m, transmitted in conjunction with compression information represented by the exponent n. In the former view, the radio frequency receiver 46 with the decoder 96 directly processes the uncompressed floating point values. In the latter view, the radio frequency receiver 46 decompresses the compressed value m based on the compression information n in accordance with the formula: uncompressed value=$m \times B^n$, and stores the uncompressed value in a suitable internal format.

The example electronics modules 54₁, 54₂, 54₃ illustrated in FIGS. 2, 3, and 4, respectively, provide digital coil outputs 92, 118, 218, respectively. These electronics modules 54₁, 54₂, 54₃ can be employed in wireless or wired receive coils. However, analog-to-digital converters consume substantial electrical power. Accordingly, the electronics modules 54₁, 54₂, 54₃ which include analog-to-digital converters may be disadvantageous in wireless coils having limited electrical power supplied by on-board batteries, storage capacitors, or the like. In some other embodiments of the electronics module 54, the coil output is a dynamically compressed analog output. In these embodiments, the compression information must be communicated to the decoder 96 and the radio frequency receiver 46, either as a signal superimposed on the compressed magnetic resonance signal or as a separate output of the coil.

With reference to FIG. 5A, an example embodiment of the electronics module 54 designated as electronics module $54_4$ is described. The magnetic resonance signal detected by the antenna 52 or the antenna 52' is dynamically compressed using a voltage-controlled amplifier 230 which is controlled by a gain controller 232 including a detector 234 and optional scaling circuitry 236. The voltage controlled amplifier 230 is a controllable amplifier/attenuator. In some preferred embodiments, the voltage controlled amplifier 230 has an exponential control transfer function which is linear with respect to gain/attenuation in dB versus voltage control signal. One suitable voltage controlled amplifier is the linear-in-dB voltage controlled amplifier AD8367 available from Analog Devices. A suitable detector for use in conjunction with a linear-in-dB voltage controlled amplifier is a demodulating logarithmic amplifier which outputs a logarithmic measure or value from the input. One suitable detector is the demodulating logarithmic amplifier AD8309 available from Analog Devices. The scaling circuitry 236 generates the gain control signal for the voltage controlled amplifier 230 from the output signal of the detector 234. The scaling circuitry 236 produces a decreasing gain (that is, increasing attenuation) with increasing level of the detected magnetic resonance signal.

The gain control signal is supplied to the radio frequency receiver 46 and the decoder 96 by superimposing it on the compressed detected magnetic resonance signal output by the voltage controlled amplifier 230. In the illustrated embodiment of FIG. 5A, this is done by inputting the gain control signal produced by the scaling circuitry 236 to a voltage controlled oscillator 240 to produce a frequency modulated gain control signal which is superimposed on the compressed magnetic resonance signal by an adder circuit 242 to produce an analog coil output signal 246. The superimposed frequency modulated gain control signal should be separable from the compressed magnetic resonance signal, for example by spacing the frequency modulated gain control signal in frequency space away from the magnetic resonance signal. The superimposed frequency modulated gain control signal should also be within the bandwidth of the radio frequency receiver 46. The resultant analog signal 246 containing both a compressed magnetic resonance signal component and a frequency modulated gain control signal component is transmitted to the receiver 46 in a suitable manner. For example, the signal can be transmitted electrically via the cable 58, or via a wireless transmission path.

With reference to FIG. 5B, the transmitted analog coil signal 246 must be properly interpreted. In one approach, off-coil signal processing circuitry 250 receives the analog coil signal 246. An analog-to-digital converter 252 digitizes the analog coil signal 246 to produce a digitized compressed coil signal containing the compressed magnetic resonance signal and gain control signal components. The digitized compressed coil signal is processed by suitable digital filtering 256, such as FFT filtering, to separate out the digital compressed magnetic resonance signal component 260 and the digital gain control signal component 262. The frequency-coded gain control signal is demodulated by a demodulator 264. The corresponding gain is computed by gain recovery circuitry 266 based on the known gain transfer function 268 of the voltage controlled amplifier 230. A digital divider 270 divides the digital compressed signal amplitude value 260 by the recovered digital gain output by the gain recovery circuitry 266 to generate the original magnetic resonance signal 272 in digital form. It is to be appreciated that the signal processing circuitry 250 may be embodied by application-specific circuitry, for example in the form of an ASIC, or may be embodied by numerical processing performed by software executing on a computer, microprocessor, microcontroller, or the like.

Figure 6:
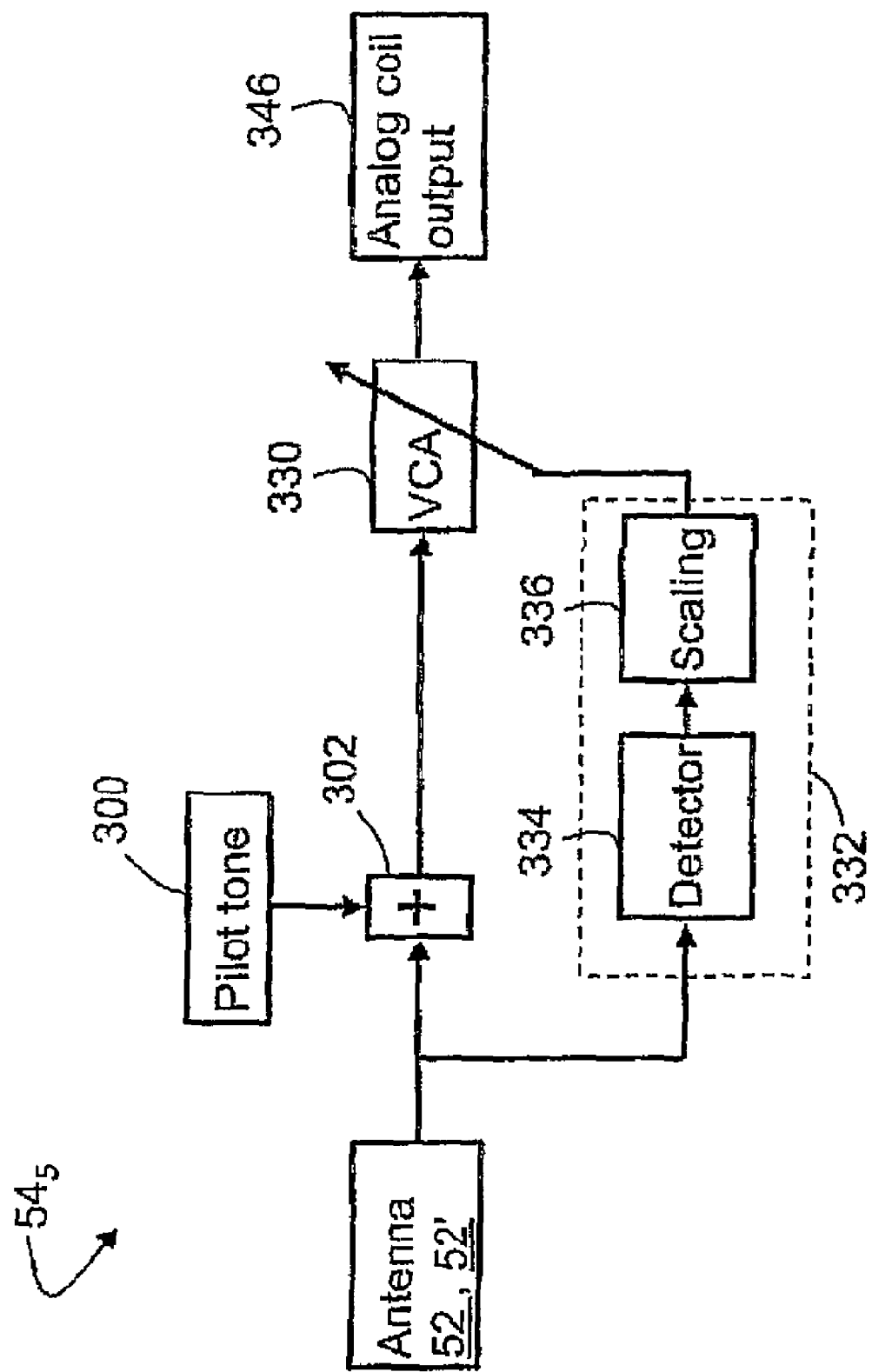

With reference to FIG. 6, an example embodiment of the electronics module 54 designated as electronics module $54_5$ is described. The electronics module $54_5$ uses the pilot tone 300 generated electronically within the coil to indicate and communicate the dynamic compression. The magnetic resonance signal detected by the antenna 52 or the antenna 52' is compressed using a voltage-controlled amplifier 330 which is controlled by a gain controller 332 including a detector 336 that detects the amplitude or intensity of the magnetic resonance signal, and suitable scaling circuitry 336 that generates the gain control signal for the voltage controlled amplifier 330 from the output signal of the detector 334. The scaling circuitry 336 produces a decreasing gain (that is, increasing attenuation) with increasing magnetic resonance signal level. Prior to inputting the antenna signal to the voltage controlled amplifier 330, an adder 302 adds the pilot tone 300 to the antenna signal. Accordingly, the added pilot tone is also amplified or attenuated by the voltage-controlled amplifier 330 in accordance with the gain control signal produced by the gain controller 332. An analog coil output signal 346 thus includes both a compressed analog magnetic resonance signal and a compressed pilot tone component.

The analog coil output signal 346 is suitably converted into a digital magnetic resonance signal representation. For example, the off-coil electronic circuitry 250 of FIG. 5B can be used, where the digital gain control signal component 262 corresponds to the compressed pilot tone component. After calibration to the maximum pilot tone level (available when no magnetic resonance signal is present and the voltage controlled amplifier 330 runs at full gain) the recovered pilot tone level directly corresponds to the gain of the voltage controlled amplifier 330. The pilot tone 300 is preferably at a frequency within the bandwidth of the antenna signal path but outside the frequency band of the magnetic resonance signal, in which case the digital filters 256 can employ an FFT or other digital filtering to separate the pilot tone from the magnetic resonance signal based on frequency.

While the pilot tone 300 is electronically injected within the coil $54_5$ in FIG. 6, in other contemplated embodiments the pilot tone is injected earlier in the signal path. For example, the pilot tone can be incorporated into the signal received by the antenna by putting a separate pilot tone antenna inside the magnet bore 14. In such embodiments, the pilot tone is detected by the receive coil and thus included in the received signal input to the gain controller; hence, in these embodiments the gain controller should include a bandstop filter before the detector 334 that blocks out the pilot tone.

Figure 7:
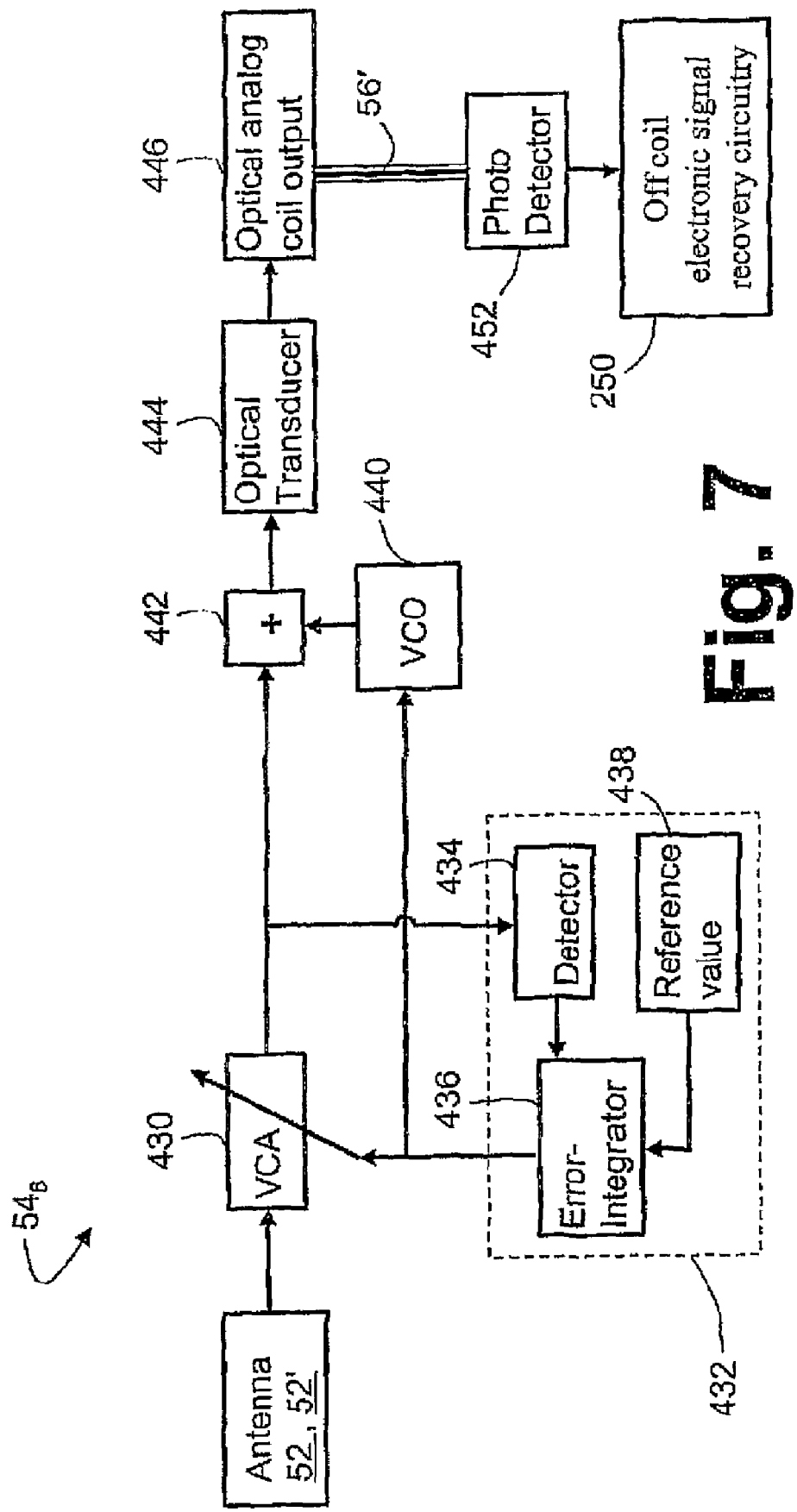

With reference to FIG. 7, an example embodiment of the electronics module 54 designated as electronics module $54_6$ is described. The magnetic resonance signal detected by the antenna 52 or the antenna 52' is compressed using a voltage-controlled amplifier 430 which is controlled by a feedback gain controller 432. The gain controller 432 includes a detector 434 that detects the output of the voltage-controlled amplifier 430, and a feedback controller or error integrator 436 that compares the value detected by the detector 434 with a reference value 438. The output of the error integrator 436 is the gain control signal. Using feedback control, the output of the voltage-controlled amplifier 430 is kept near the reference value 438.

In the arrangement of FIG. 5A the input to the gain controller 232 is the uncompressed magnetic resonance signal taken from the antenna, the voltage controlled amplifier 230 has an exponential control transfer function, and the detector 234 produces a logarithmic measure or value from the input.

In contrast, in the arrangement of FIG. 7 the input to the gain controller 432 is the output of the voltage-controlled amplifier 430. That is, the feedback gain controller 432 receives as input the compressed signal which is fed back to the gain controller 432. The feedback gain controller 432 does not require a non-linear logarithmic level detector. This reduces the hardware complexity; indeed, in some embodiments the voltage controlled amplifier 430, the detector 434, and the error integrator 436 are embodied as a single integrated circuit, such as the AD8367 integrated circuit available from Analog Devices.

The gain control signal output by the error integrator 436 is also frequency modulated by a voltage controlled oscillator 440, and the frequency modulated gain control signal is superimposed on the compressed magnetic resonance signal by an adder circuit 442 and optically modulated by an optical transducer 444 to produce an analog optical coil output signal 446. In the embodiment of FIG. 7, this optical output is transmitted to the radio frequency receiver 46 by an optical fiber or optical fiber bundle 58' that substitutes for the electrical cable 58 of FIG. 1. A photodetector 452 disposed in or with the radio frequency receiver 46 converts the optical signal back to an electrical signal, which is suitably converted into a digital magnetic resonance signal representation by the off-coil electronic circuitry of FIG. 5B.

In the example electronics modules $54_4$, $54_6$ illustrated in FIGS. 5A and 7, respectively, the gain control signal is frequency modulated and superimposed on the compressed magnetic resonance signal. In other contemplated embodiments, the gain control signal is transmitted to the radio frequency receiver 46 as a separate signal, e.g., using a voltage controlled oscillator with high frequency deviation in the UHF or microwave range and wireless transmission to the radio frequency receiver. In still yet other contemplated embodiments the gain control signal is encoded, modulated, and transmitted to the receiver 46 with any other suitable state-of-the-art method.

With reference to FIG. 8, an example embodiment of the electronics module 54 designated as electronics module $54_7$ is described. After preamplification by a pre-amplifier 528, the magnetic resonance signal detected by the antenna 52 or the antenna 52' is compressed using a voltage-controlled amplifier 530 which is controlled by a feedback gain controller 532 that is disposed off-coil. The compressed analog coil signal is transmitted via a low dynamic range (e.g., 80 dB dynamic range) wireless transmission path or transmission cable 540 to off-coil circuitry including, for example an amplifier 542 followed by an analog-to-digital converter 544. The digitized signal is input to the feedback gain controller 532. The gain control signal produced by the feedback gain controller 532 is communicated back to the coil electronics $54_6$ via a control signal transmission path 550, which may be wired or wireless, and used to control the voltage-controlled amplifier 530. The gain control signal is also used by digital magnetic resonance signal recovery circuitry 552 to interpret the digitized signal output by the analog-to-digital converter 544. For example, the recovery circuitry 552 suitably determines the gain corresponding to the gain control signal from the known gain transfer function of the voltage-controlled amplifier 530, and recovers the original signal amplitude by dividing the digitized compressed signal amplitude value output by the converter 544 by the gain.

The arrangement of FIG. 8 advantageously places complex analog-to-digital converters and other highly power-consumptive circuitry off-coil, while providing compressed coil output for transmission via the low dynamic range wireless transmission path or transmission cable 540. Typically, the lowest dynamic range path portion is that portion running from the coil to off-coil electronics. However, the concept of FIG. 8 can be generalized to: (i) separating the signal compression and corresponding compression control circuitry, (ii) placing the signal compression circuitry upstream of the dynamic range limiting transmission path or component, (iii) placing the compression control circuitry downstream of the dynamic range limiting transmission path or component, and (iv) feeding the gain control signal back upstream from the compression control circuitry to the signal compression circuitry.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having described the preferred embodiments, the invention is now claimed to be:

1. A radio frequency receive coil for use in a magnetic resonance imaging scanner, the receive coil comprising:
   an antenna tuned to a magnetic resonance frequency to detect a magnetic resonance signal; and
   electronics disposed on or with the antenna as a unitary structure, the electronics including compression circuitry compressing the magnetic resonance signal at a gain controlled by a gain control signal to produce a compressed magnetic resonance signal, the electronics generating a reduced dynamic range representation of the magnetic resonance signal based on the compressed magnetic resonance signal, the reduced dynamic range representation of the magnetic resonance signal being communicated off the receive coil.

2. The receive coil as set forth in claim 1, wherein the electronics further include:
   a gain controller that outputs the gain control signal based on the magnetic resonance signal.

3. The receive coil as set forth in claim 2, wherein the electronics further include:
   an encoder that encodes the gain control signal; and
   a signal combiner that superimposes the encoded gain control signal on the compressed magnetic resonance signal to produce the reduced dynamic range representation of the magnetic resonance signal that is communicated off the receive coil.

4. The receive coil as set forth in claim 3, wherein the gain control signal is a gain control voltage, and the encoder includes:
   a voltage controlled oscillator that encodes the gain control voltage as a frequency modulated gain control signal.

5. The receive coil as set forth in claim 2, wherein the electronics further include:
   a pilot tone generator producing a pilot tone at a frequency distinguishable from the magnetic resonance signal; and
   a signal combiner that superimposes the pilot tone on the magnetic resonance signal prior to input to the compression circuitry, the superimposed pilot tone being compressed along with the magnetic resonance signal by the compression circuitry.

6. The receive coil as set forth in claim 2, wherein the gain controller receives the magnetic resonance signal as an input and outputs the gain control signal based on the magnetic resonance signal.

7. The receive coil as set forth in claim 2, wherein the gain controller receives the compressed magnetic resonance signal as an input, the gain controller including:
a feedback controller that adjusts the gain control signal to maintain the compressed magnetic resonance signal near a reference value.

8. The receive coil as set forth in claim 2, wherein the electronics further include:
an analog to digital converter that digitizes the compressed magnetic resonance signal to produce a digitized compressed magnetic resonance signal; and
combining circuitry that digitally combines the digitized compressed magnetic resonance signal and the gain control signal to produce the reduced dynamic range representation of the magnetic resonance signal that is communicated off the receive coil as a digitized representation of the magnetic resonance signal.

9. The receive coil as set forth in claim 8, wherein:
the gain controller includes a logarithmic amplifier logarithmically amplifying the magnetic resonance signal; and
the combining circuitry produces the digitized representation of the magnetic resonance signal as a floating point digital value having an exponent corresponding to the logarithmic amplifier output and a mantissa corresponding to the digitized compressed magnetic resonance signal.

10. The receive coil as set forth in claim 2, wherein the reduced dynamic range representation of the magnetic resonance signal that is communicated off the receive coil includes at least:
(i) the compressed magnetic resonance signal, and
(ii) the gain control signal,
the compressed magnetic resonance signal and the gain control signal being communicated off the receive coil via separate transmission paths.

11. The receive coil as set forth in claim 1, wherein the gain control signal is received by the electronics from an associated feedback gain controller disposed off of the coil via an input control signal transmission path.

12. The receive coil as set forth in claim 1, further including:
a generally planar substrate on which antenna and electronics are disposed, the antenna being formed of conductive traces disposed on the substrate.

13. The receive coil as set forth in claim 1, wherein the antenna supports the electronics.

14. A magnetic resonance imaging scanner comprising:
a main magnet producing a main magnetic field in an imaging volume;
magnetic field gradient coils selectively superimposing selected magnetic field gradients on the main magnetic field within the imaging volume;
a radio frequency transmitter selectively injecting a radio frequency excitation at a magnetic resonance frequency into the imaging volume;
a radio frequency receive coil as set forth in claim 1 for receiving a magnetic resonance signal generated in the imaging volume by the injected radio frequency excitation; and
a radio frequency receiver receiving the reduced dynamic range representation of the magnetic resonance signal communicated off the receive coil.

15. The magnetic resonance imaging scanner as set forth in claim 14, wherein the reduced dynamic range representation of the magnetic resonance signal communicated off the receive coil includes the gain control signal and the compressed magnetic resonance signal as separable components, the radio frequency receiver including:
extraction circuitry for extracting the gain control signal component and the compressed magnetic resonance signal component from the reduced dynamic range representation of the magnetic resonance signal.

16. The magnetic resonance imaging scanner as set forth in claim 14, further including:
a feedback gain controller separate from the radio frequency receive coil, the feedback gain controller generating the gain control signal based on the reduced dynamic range representation of the magnetic resonance signal communicated off the receive coil, the gain control signal being communicated from the separate feedback gain controller to the radio frequency receive coil.

17. A radio frequency receive coil for use in a magnetic resonance imaging scanner, the receive coil comprising:
an antenna tuned to a magnetic resonance frequency to detect a magnetic resonance signal; and
electronics disposed on or with the antenna as a unitary structure, the electronics including:
a plurality of amplifiers each having an output with a different gain respective to the antenna,
digitizing circuitry that digitizes at least a selected highest amplifier output that does not overload the digitizing circuitry, and
encoding circuitry that combines the digitized output with an indication of the selected amplifier gain to produce a reduced dynamic range representation of the magnetic resonance signal that is communicated off the receive coil.

18. The receive coil as set forth in claim 17, wherein the digitizing circuitry includes:
a plurality of analog to digital converters digitizing the outputs of the plurality of amplifiers; and
selection circuitry that selects the largest output of the plurality of analog to digital converters that is not overloaded as the digitized output of the digitizing circuitry.

19. The receive coil as set forth in claim 17, wherein the plurality of amplifiers are arranged in a topology selected from:
(i) a parallel arrangement of amplifiers, each amplifier having a different gain and receiving a same input signal corresponding to the magnetic resonance signal, and
(ii) a cascade of amplifiers having the same or different gains, in which some amplifier outputs serve as inputs to other amplifiers, the magnetic resonance signal being input to the cascade of amplifiers.

20. A radio frequency receive method for use in a magnetic resonance imaging scanner, the method comprising:
detecting a magnetic resonance signal using an antenna tuned to a magnetic resonance frequency; and
processing the detected magnetic resonance signal using electronics disposed on or with the antenna as a unitary structure, the processing including:
compressing the magnetic resonance signal at a gain controlled by a gain control signal to produce a compressed magnetic resonance signal,
generating a reduced dynamic range representation of the magnetic resonance signal based on the compressed magnetic resonance signal, and
communicating the reduced dynamic range representation of the magnetic resonance signal off the receive coil.

21. The method as set forth in claim 20, wherein the generating of the reduced dynamic range representation of the magnetic resonance signal includes:

combining the compressed magnetic resonance signal with an indication of the gain to produce the reduced dynamic range representation.

22. The method as set forth in claim 20, wherein the generating of the reduced dynamic range representation of the magnetic resonance signal includes:

frequency modulating the gain control signal; and superimposing the frequency modulated gain control signal on the compressed magnetic resonance signal.

23. The method as set forth in claim 20, wherein the generating of the reduced dynamic range representation of the magnetic resonance signal includes:

combining a pilot tone with the magnetic resonance signal prior to compressing.

24. The method as set forth in claim 20, wherein the generating of the reduced dynamic range representation of the magnetic resonance signal includes:

digitizing the compressed magnetic resonance signal to produce a digitized compressed magnetic resonance signal;

digitizing the gain control signal to produce a digitized gain control signal; and combining the digitized compressed magnetic resonance signal and the digitized gain control signal to produce the reduced dynamic range representation of the magnetic resonance as a digital representation of the magnetic resonance signal.

25. The method as set forth in claim 24, wherein the combining of the digitized compressed magnetic resonance signal and the digitized gain control signal defines a floating point digital representation of the magnetic resonance signal.

* * * * *